(12) United States Patent
Matsumoto

(10) Patent No.: US 7,190,760 B2
(45) Date of Patent: Mar. 13, 2007

(54) METHOD FOR ADJUSTING GAP BETWEEN TWO OBJECTS AND EXPOSURE METHOD USING THE SAME, GAP ADJUSTING APPARATUS, AND EXPOSURE APPARATUS

(75) Inventor: Takahiro Matsumoto, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/411,462

(22) Filed: Apr. 25, 2006

(65) Prior Publication Data

US 2006/0193432 A1   Aug. 31, 2006

Related U.S. Application Data

(63) Continuation of application No. 10/183,332, filed on Jun. 25, 2002, now Pat. No. 7,062,010.

(30) Foreign Application Priority Data

Jun. 26, 2001 (JP) .............................. 2001-192866

(51) Int. Cl.
*G21K 5/00* (2006.01)
(52) U.S. Cl. ..................... 378/34; 250/492.1
(58) Field of Classification Search .................. 378/34, 378/35; 250/492.1, 492.2, 559.3; 356/399, 356/400, 614, 625; 355/53, 71
See application file for complete search history.

(56) References Cited

U.S. PATENT DOCUMENTS 4,085,329 A    4/1978  McCoy et al.
4,187,431 A    2/1980  Hundt
5,114,236 A    5/1992  Matsugu et al.
5,151,754 A    9/1992  Ishibashi et al.
5,239,183 A    8/1993  Kouno et al.
5,291,023 A    3/1994  Hasegawa et al.
6,144,719 A   11/2000  Hasegawa et al.
6,154,281 A   11/2000  Sentoku et al.
2003/0020891 A1  1/2003 Toshinobu

FOREIGN PATENT DOCUMENTS

JP         2001012905 A  *  1/2001

\* cited by examiner

*Primary Examiner*—Edward J. Glick
*Assistant Examiner*—Chih-Cheng Glen Kao
(74) *Attorney, Agent, or Firm*—Morgan & Finnegan, LLP

(57) ABSTRACT

A method of making a gap between first and second objects have a predetermined value includes steps of introducing light to an entry window on the first object, detecting an intensity of light from an exit window on the first object, and positioning the second object, with respect to a direction concerning the gap, based on an intensity of light detected in the detecting step. The exit window is positioned so that light enters through the entry window of the first object, reflects off the second object, and then enters the exit window of the first object if the gap has the predetermined value.

6 Claims, 13 Drawing Sheets

METHOD FOR ADJUSTING GAP BETWEEN TWO OBJECTS AND EXPOSURE METHOD USING THE SAME, GAP ADJUSTING APPARATUS, AND EXPOSURE APPARATUS

This application is a continuation of application Ser. No. 10/183,332, filed Jun. 25, 2002 now U.S. Pat. No. 7,062,010, which is incorporated herein in its entirety.

BACKGROUND OF THE INVENTION

The present invention relates to methods for adjusting an interval or gap between two parallel arranged, plate-shaped objects and exposure methods using the same, and gap adjusting apparatuses and exposure apparatuses. More specifically, it relates to a method for detecting a proper gap between a mask and a wafer in a proximity exposure apparatus which exposes a desired pattern by radiating light onto the wafer through the mask arranged in close proximity to the wafer, an exposure method for exposing while using the above to arrange the mask and wafer such that they have a predetermined gap, a gap determination apparatus, and an exposure apparatus.

One example of apparatus that needs to keep two plate-shaped objects located in parallel at a predetermined gap is a proximity semiconductor exposure apparatus that locates a mask in a close proximity to a wafer, radiates light through this mask, and exposes a pattern created on the mask onto the wafer.

For a semiconductor integrated circuit fabricated by using such a semiconductor exposure apparatus, higher density and higher throughput has been promoted, and along with this, it has been demanded to form an integrated circuit with a narrow line width and a fine pattern. Accordingly, a semiconductor exposure apparatus is required to have high throughput as well as high resolution. It is also demanded for multiple exposure operations in which multiple circuit patterns are overlaid above one wafer to put multiple exposure positions in place with high precision. Further, use of a shorter wavelength of exposure light has been promoted for higher resolution, and thus an exposure apparatus using an X-ray light Source has been developed. FIG. 16 shows a typical plan view of an example of such a conventional X-ray exposure apparatus.

This X-ray exposure apparatus includes a wafer chuck 94 that holds a wafer 93, and a mask chuck 91 that holds a mask 92 in parallel to and close to the wafer 93. The wafer chuck 94 is supported on a fine adjustment stage 95 that adjusts its position in XYZ-directions finely, and the fine adjustment stage 95 is further supported on a rough adjustment stage 96 that adjusts its position in XY-directions roughly. The mask chuck 91 is supported on a bottom surface of the mask chuck base 97 that is located opposite to the wafer chuck 94. An X-ray light source (not shown) is installed above the mask chuck base 97, and an opening is provided on the mask chuck base 97, through which an X-ray is radiated from top to bottom almost vertically.

An X-ray emitted from the X-ray light source is radiated, through the mask 92, onto the wafer 93 to which resist has been applied, thus exposing the resist. In exposing the wafer 93 using a specified pattern formed on the mask 92, the resist is exposed and this pattern is transferred. By removing exposed or unexposed part of the resist that has been exposed by the specified pattern, a semiconductor circuit of the specified pattern is created.

In order to expose a specified pattern at a specified position on the wafer 93, the above described exposure apparatus uses the rough adjustment stage 96 and fine adjustment stage 95 for locating the wafer 93 at a specified position relative to the mask 92 and performing an exposure operation there.

At this time, a gap between the mask 92 and wafer 93 needs to be correctly adjusted. This is because a radiated X-ray, which is irradiated in an almost vertical direction but not completely as shown in FIG. 17, has divergent and convergent angles to some extent, thus being directed to a direction slightly away from the vertical direction. In other words, since the X-ray propagating direction shifts from the vertical direction, the pattern on the mask 92 is exposed onto the wafer 93 at a position slightly away from vertically right under the pattern. This shift becomes larger as the gap between the mask 92 and the wafer 93 becomes wider. Therefore, if the gap fluctuates, there arises a change in exposure position (i.e., run-out error).

This exposure-position shift is problematic especially when different exposure apparatuses are used to overlay and form multiple semiconductor circuit patterns onto one wafer 93. For example, as shown in FIG. 17, when two exposure apparatuses, such as exposure apparatuses A and B which have different gaps between the masks 92 and wafers 93, are used to expose two circuit patterns, there arises a shift amount shown by RE between the two circuit-pattern exposure positions. As a result, two circuit patterns do not match well, possibly causing a defective semiconductor device.

One known, conventional method for setting a gap to be a predetermined amount between the mask 92 and wafer 93 to contact the mask 92 and wafer 93 once, making the gap in that state to be 0, and then moving the wafer 93 in a direction z by a predetermined amount. However, this method is likely to damage the mask 92 and wafer 93, cause foreign particles to be stuck between them after contacting them, and negatively affect the fine adjustment stage 95 by causing an unnecessary force to be applied to it by the contact.

BRIEF SUMMARY OF THE INVENTION

Accordingly, it is an object of the present invention to provide a method and apparatus for measuring a gap between two objects and confirming that a gap between two parallel arranged, plate-shaped objects is a predetermined absolute value, and an exposure method and apparatus for exposing while using the above method and apparatus to maintain a gap between a mask and wafer at a specified absolute value.

A method of one aspect of the present invention for determining an arrangement of first and second objects such that a gap between the first and second objects becomes a predetermined gap includes the steps of forming a light transmitting entry window on the first object, forming a light transmitting exit window on the first object at such a position that light would enter through the entry window the second object, reflect off the second object or off the first and second objects, and then enter the exit window of the first object if the first and second objects are arranged in parallel at the predetermined gap, introducing light to the entry window to provide the second object with the light, detecting an intensity of light from the exit window, and determining the arrangement for the predetermined gap based on the detected light intensity.

An apparatus of another aspect of the present invention for determining an arrangement of first and second objects such that a gap between the first and second objects becomes a predetermined gap includes a light transmitting entry window formed in the first object, a light transmitting exit window formed in the first object at such a position that light would enter through the entry window of the first object at a specified angle of incidence, reflect off the second object or off the first and second objects, and then enter the exit window of the first object if the first and second objects are arranged in parallel at the predetermined gap, a light source that introduces light through the entry window to provide the second object with the light at the specified angle of incidence, a light intensity measuring sensor for detecting an intensity of light from the exit window, and a mechanism for moving the second object, in a direction that varies a gap with the first object, wherein the arrangement being determined for the predetermined gap based on the intensity of light detected by the sensor.

The sensor may measure an intensity of light exiting from the exit window, while the light source introduces the light to the entry window and the mechanism moves the second object, and the arrangement being determined for the predetermined gap based on an arrangement in which the sensor detects the strongest intensity of light.

The apparatus may further include a diffraction grating formed in the entry window, the light source introducing light to the entry window at the specified angle of incidence to generate diffracted light that is guided from the entry window to the second object at the specified angle.

$Px=\lambda/\sin\theta$ may be met where Px is a pitch of the diffraction grating in a direction parallel to an incident plane of light entering the second object at the specified angle of incidence, $\lambda$ is a wavelength of light emitted by the light source, and $\theta$ is the specified angle of incidence of light entering the second object, and wherein the light source introduces the light with the wavelength of $\lambda$ to the entry window from a direction perpendicular to the pitch direction of the diffraction grating, and first order diffracted light from the entry window is guided to the second object at the specified angle of incidence of $\theta$.

The light source introduces the light to the entry window in such a direction that an incident angle component at an incident plane of light entering the second object at the specified angle is the specified angle of incidence.

$D=2 nG \tan\theta$ may be met where D is a gap between the entry window and the exit window, $\lambda$ is a wavelength of light emitted by the light source, $\theta$ is the incident angle of light entering the second object, G is the predetermined gap between the first and second objects, and n is an arbitrary natural number.

The apparatus may further include two sets of the entry windows and exit windows corresponding to the entry windows arranged on the first object and lined up in a straight line, wherein the light source introduces light mutually inclined in opposite directions from the entry windows to the second object at the same specified angle of incidence, an average of arrangements being determined as the arrangement for the predetermined gap, each of the arrangements providing the strongest intensity of the light that has passed through one of the two sets.

The apparatus may further include on the entry window a diffraction grating that has a predetermined pitch in a direction parallel to an incident plane of light entering the second object at the specified angle of incidence, wherein the light source introduces light to the entry window from a direction perpendicular to the pitch direction of the diffraction grating, causing plus and minus first order diffracted light from the entry window mutually inclined in opposite directions to the second object at the same specified angle.

$Py=\lambda/\sin\alpha$ may be met where Py is a pitch of a diffraction grating formed in the entry window in a direction perpendicular to the incident plane of light entering the second object at the specified angle of incidence, $\lambda$ is a wavelength of light emitted by the light source, and wherein the light source introduces light to the entry window in such a direction that an incident angle component at a plane perpendicular to an incident plane of light entering the second object at the specified angle of incidence is $\alpha$.

The apparatus may further include a diffraction grating formed in the exit window.

An exposure apparatus of another aspect of the present invention for exposing a wafer with a pattern formed on a mask by irradiating light from an exposure light source through the mask includes a stage for moving the wafer, and an arranging apparatus for determining an arrangement of the mask and wafer such that a gap between the mask and wafer becomes a predetermined gap, the arranging apparatus including a light transmitting entry window formed in the mask, a light transmitting exit window formed in the mask at such a position that light would enter through the entry window the wafer at a specified angle of incidence, reflect off the wafer or off the mask and wafer, and then enter the mask if the mask and wafer are arranged in parallel at the predetermined gap, a light source that introduces light through the entry window to provide the wafer with the light at the specified angle of incidence, a light intensity measuring sensor for detecting an intensity of light from the exit window, and the stage for moving the wafer in a direction that varies a gap with the mask, wherein the arrangement is determined for the predetermined gap based on the intensity of light detected by the sensor.

The exposure light source may be an X-ray light source.

The exposure apparatus may further include a diffraction grating formed in the entry and exit windows, and the light source and the sensor are integrated into one member.

DETAILED DESCRIPTION OF THE PREFERRED EMBODIMENTS

A description will now be give of various embodiments according to the present invention with reference to accompanying drawings.

(First Embodiment)

Figure 1:
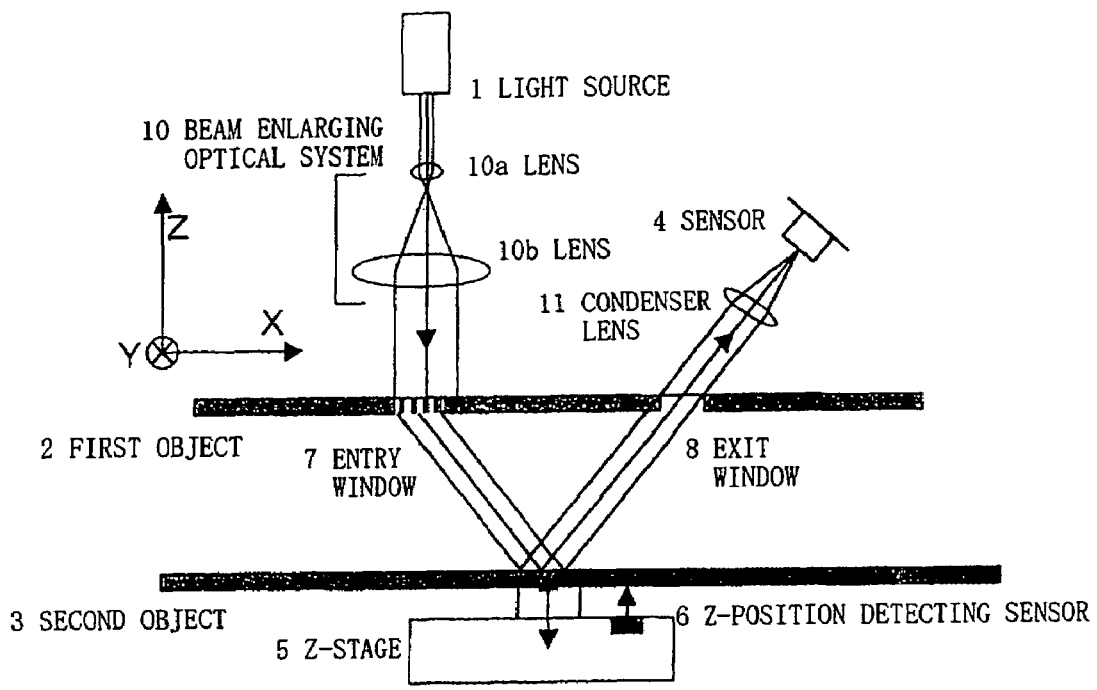
FIG. 1 is a typical sectional view for explaining a method of a first embodiment according to the present invention, which adjusts a gap between two plate-shaped objects.

FIG. 1 is a typical sectional view for explaining a method of a first embodiment according to the present invention, which adjusts a gap between a first plate-shaped object 2 and a second plate-shaped object 3. The second object 3 is disposed on a Z-stage 5 that can support and move it in a Z-direction. The Z-stage 5 is provided with a Z-position detecting sensor 6 that detects a position of the second object 3 in the Z-direction. The first object 2 is fixed parallel to the second object 3.

On the first object 2 are provided a light source and a beam enlarging optical system 10 that reshapes light radiated from it into a beam with a desired diameter, which includes lenses 10a and 10b. This optical system may be a beam reducing optical system. In addition, a sensor 4 is provided that detects light introduced via a condenser lens 11.

This embodiment has processed the first object 2 to adjust a gap, i.e., by opening a light transmitting entry window 7 and exit window 8 spaced at a specified distance in X-direction. The entry and exit windows 7 and 8 may be of an equal size. The light source 1 and the beam enlarging optical system 10 are adapted so as to introduce light to the entry window 7 on the first object 2 perpendicularly from above. The entry window 7 has a light transmitting part with a transmitting-type linear diffraction grating arranged at a fixed pitch in X-direction. If it is assumed that a pitch of this diffraction grating is Px, and the wavelength of the light guided vertically from above is $\lambda$, Px and $\lambda$ meet the following equation (1) so that light introduced may be diffracted at 1st order diffracted angle $\theta$, as shown FIG. 2.

$$Px = \lambda / \sin\theta \quad (1)$$

Figure 2:
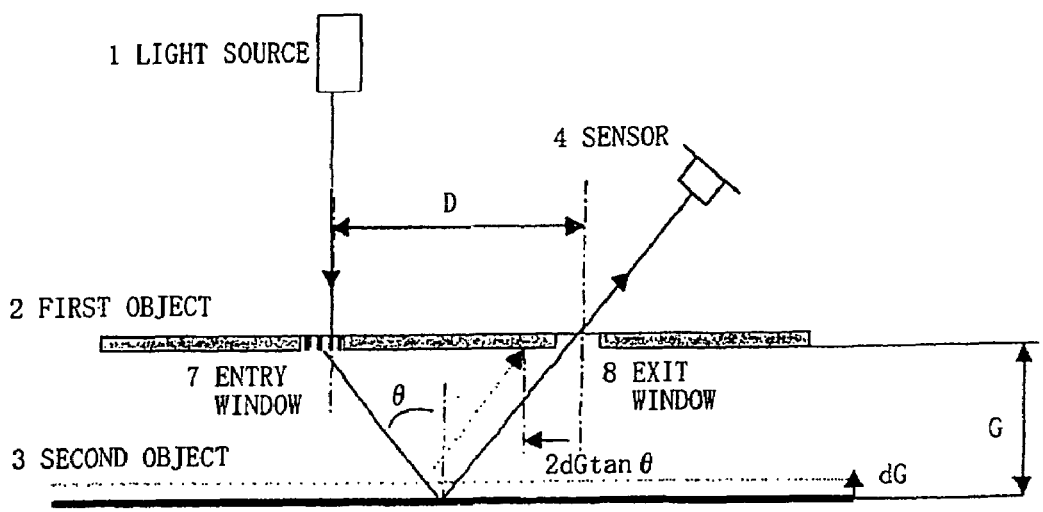
FIG. 2 is a typical sectional view showing the size of each part in the method shown in FIG. 1.

As shown in FIG. 2, if it is assumed that a gap between the first and second objects 2 and 3 is a predetermined gap G (a designed gap), a gap D between the entry and exit window 7 and 8 meets the following equation (2) so that 1st order diffracted light produced from light introduced to and diffracted by the entry window 7 may make a regular reflection off the surface of the second object 3 and the reflected light may pass through the exit window 8.

$$G = D/(2\tan\theta) \quad (2)$$

The sensor 4 is arranged at such a position that it can detect the reflected light from the exit window 8.

Figure 3:
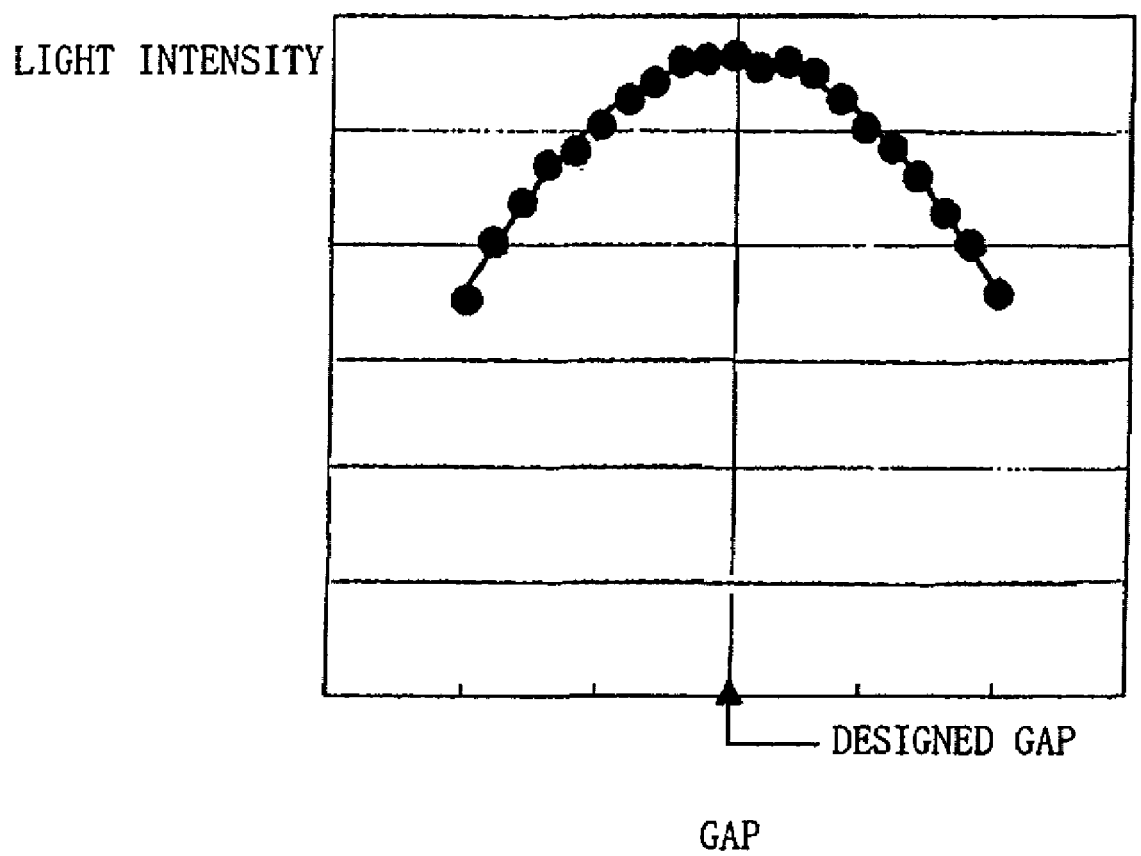
FIG. 3 is a graph showing the changing intensity of light detected by a sensor for various gaps between two objects in the method shown in FIG. 1.

The method for adjusting a gap between two objects according to this embodiment is carried out by varying a position of the second object 3 in the Z-direction by use of the Z-stage 5 while introducing light with a wavelength of $\lambda$ from the light source 1 to the entry window 7 in the first object 2. At this time, the sensor 4 detects a changing intensity of the light from the exit window 8. FIG. 3 shows the changing light intensity measured in this way by assigning a horizontal axis to a Z-position of the second object 3 measured by the Z-position detecting sensor 6. The Z-position of the second object 3 corresponds to a gap between the first and second objects, thus indicating it as a gap in FIG. 3.

Since the wavelength $\lambda$, the pitch Px, and the distance D are set as described above, when a gap between the first and second objects 2 and 3 is G, the 1st order diffracted light from the entry window 7 makes a regular reflection and its reflected light passes through the exit window 8, thus reaching the sensor 4. If the gap shifts by dG from there, the incident position of the reflected light off of the first object 2 shifts by 2 dG tan $\theta$, as shown in FIG. 2, and thus the light will be at least partially shielded by the first object. Accordingly, as shown in FIG. 3, the intensity of the light emitted from the exit window 8 is the maximum when the gap between the first and second objects 2 and 3 is the predetermined gap G, and becomes weaker as the gap shifts from G.

The method for adjusting a gap according to the present embodiment determines, as described above, that the arrangement that provides the strongest intensity of light measured by the sensor 4 is the arrangement that the first and second objects 2 and 3 form the predetermined gap G. According to this method, a gap between two objects can be adjusted without contacting the first and second objects, and thus both objects may be positioned with a predetermined gap in between with high precision.

This embodiment may determine the arrangement that provides the strongest intensity of the light detected by the sensor 4, by calculating an approximate curve for a graph of changing light intensity shown in FIG. 3, using a quadratic function and the like and based on the peak position of this approximated curve. Thus, it is possible to more precisely determine the arrangement that provides the strongest light intensity.

(Second Embodiment)

Figure 4:
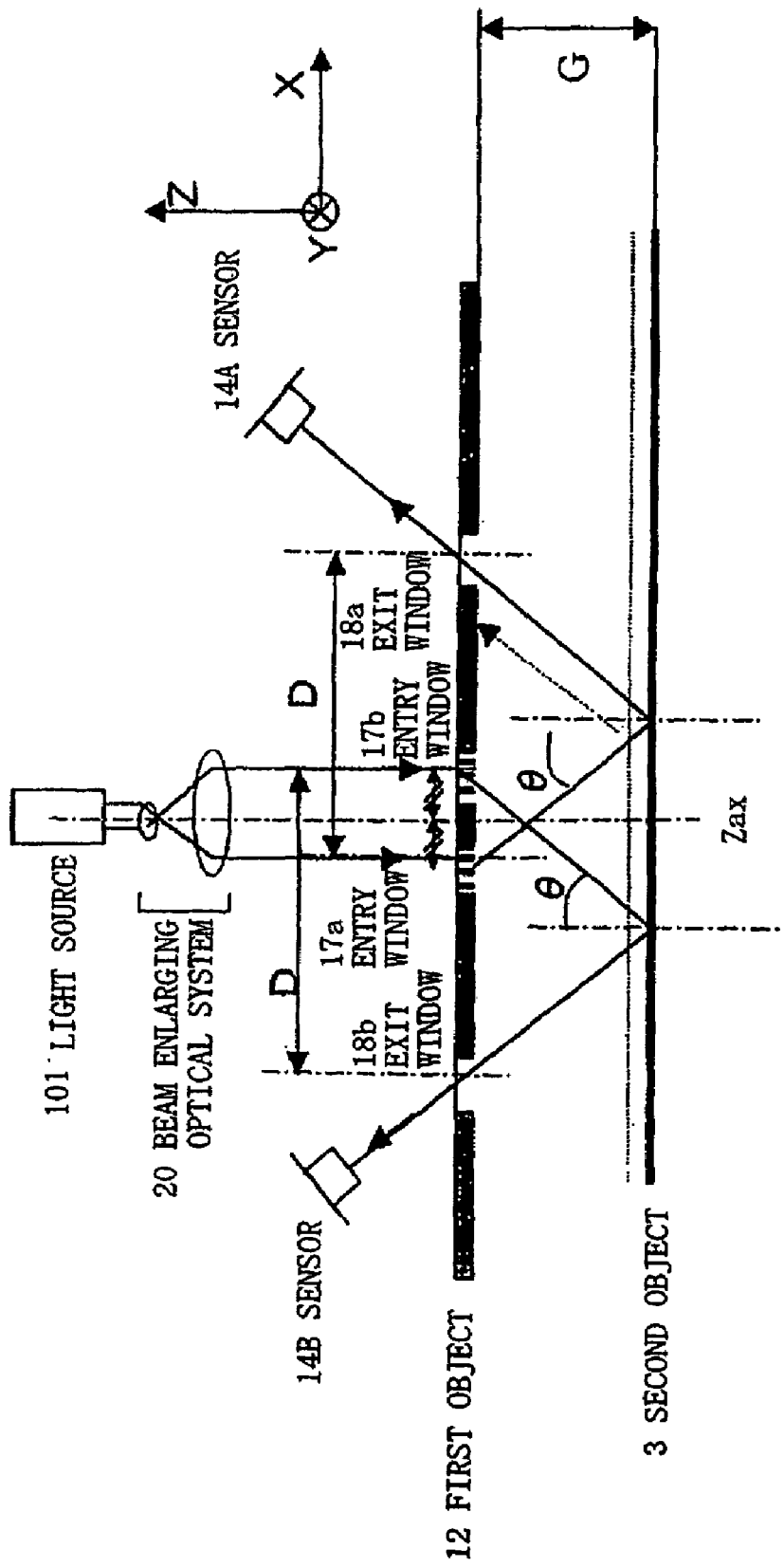
FIG. 4 is a typical sectional view for explaining a method of a second embodiment according to the present invention, which adjusts a gap between two plate-shaped objects.
Figure 5:
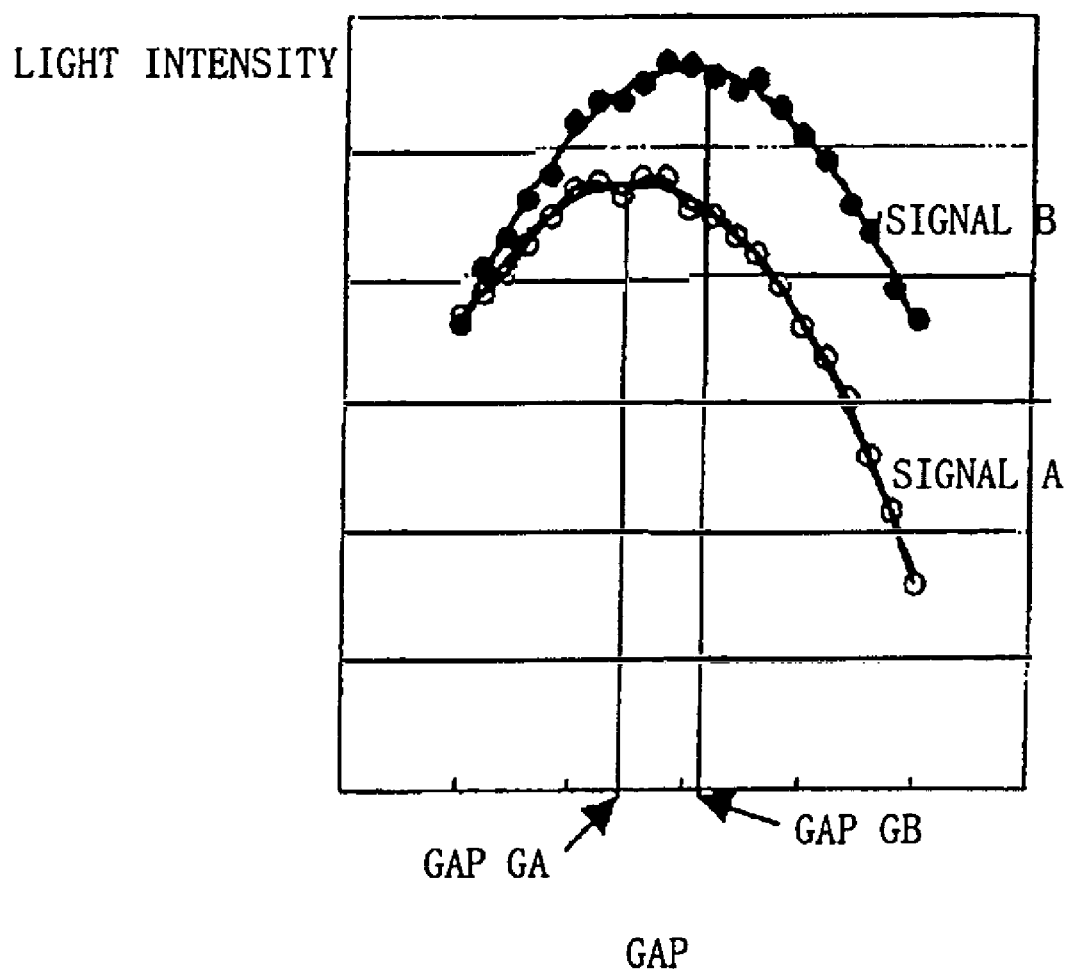
FIG. 5 is a graph showing the changing intensity of light detected by a sensor for various gaps between two objects in the method shown in FIG. 4.

Referring to FIGS. 4 and 5, a description will now be given of the second embodiment. FIG. 4 is a typical sectional view for explaining a method of this embodiment according to the present invention, which adjusts a gap between two plate-shaped objects. An element in these figures, which corresponds to that in the first embodiment, is designated by the same reference numeral, and a description thereof will be partially omitted.

A method for adjusting a gap according to this embodiment provides two entry windows 17a and 17b and two corresponding exit windows 18a and 18b in the first object 12. The entry windows 17a and 17b are located near the center of the figure and close to each other, and the exit windows 18a and 18b are provided at one side of the entry windows 17a and 17b. A light source 101 and a beam enlarging optical system 20 are provided around the center of FIG. 4 so that they can introduce light perpendicularly from above to both of the comparatively close entry windows 17a and 17b.

Similar to the first embodiment, the entry windows 17a and 17b are formed into a linear diffraction grating with the pitch Px that meets the equation (1) so that incident light with a wavelength of λ may be diffracted by a 1 st order diffracted angle of θ. A distance between the entry and exit windows 17a and 18a, and that between the entry and exit windows 17b and 18b are both set to a gap D that satisfies the equation (2). In other words, like the first embodiment, when a gap between the first and second object 12 and 3 is the designed gap, light that has made a 1st order diffraction from the entry windows 17a and 17b, and made a regular reflection off the surface of the second object 3 will pass <through the exit windows 18a and 18b, respectively. The sensors 14a and 14b are located to detect the light having passed through the exit windows 18a and 18b in this way.

Similar to the first embodiment, the procedure of adjusting the gap is to detect the light intensity by using the sensors 14a and 14b while moving the second object up and down by the Z-stage (not shown).

The method for adjusting a gap according to this embodiment has an object to obtain a desired gap between two objects with high precision even if the relative position between the first and second objects 12 and 3 has a slightly shifted tilt component (ωy) around the Y-axis. A description will be given of this below.

A description will now be given of a case where there is a little shifted tilt component ωy between the first and second objects 12 and 3. In this case, the light intensities detected by the sensors 14a and 14b both become, similar to the first embodiment, the strongest when the gap between the two objects is the designed gap G, and become weaker as it shifts from the designed gap G. Therefore, the arrangement that provides the strongest light intensity detected by each of the sensors 14a and 14b can be determined as the arrangement that the gap between the first and second objects 12 and 3 is the predetermined gap G.

As shown in FIG. 5, the gap Ga that provides the strongest light intensity (signal a) detected by the sensor 14a is different from the gap Gb that provides the light intensity (signal b) detected by the sensor 14b.

FIG. 5 shows a detection result where the second object 3 tilts in a clockwise direction of FIG. 4 relative to the first object 12. In this case, as it goes farther to the right in FIG. 4, the gap between the two becomes wider. Further, an angle of incidence of the 1st order diffracted light entering the second object 3 becomes large for the incident light from the entry window 17a, which is guided diagonally to the lower right of FIG. 4, and becomes small for the incident light from the entry window 17b, which is guided diagonally to the lower left of FIG. 4. This means that the arrangement that provides the strongest light intensity detected by the sensor 14a shifts to such a side as decreases the gap between the two objects, and the arrangement that provides the strongest light intensity detected by the sensor 14b shifts to such a side as increases the gap between the two objects.

Here, an optical system of this embodiment for adjusting the gap is arranged symmetrically relative to a ZaX-axis as an axis in the Z-direction, in the center of the entry windows 17a and 17b shown in FIG. 4. Accordingly, each shift amount between the gaps Ga/Gb and the designed gap G between the two objects along this ZaX-axis becomes almost equal, i.e., G−Ga=Gb−G. Thus, the arrangement that provides the gap G between two objects along the ZaX-axis results from the gap G calculated by an average between the gaps Ga and Gb where the light intensity detected by the sensor 14a and 14b becomes the strongest:

$$G=(Ga+Gb)/2 \qquad (3)$$

By moving the second object 3 by use of the Z-stage so that the position of the second object 3 measured by the Z-position detecting sensor (not shown) becomes the position equivalent to the gap G, a gap between the two objects along the ZaX-axis can be adjusted with high precision. As described, according to this embodiment, even though there is a slightly shifted tilt component around the Y-axis at relative position between two objects, a gap between the two objects can be adjusted to a desired gap with high precision.

Further, in this embodiment, even if there is a slightly shifted tilt component (ωx) around the X-axis at the relative position between two objects, this shift does not influence the gap determination, thus making a gap along the ZaX-axis a desired gap. This is true of the first embodiment.

(Third Embodiment)

Figure 6:
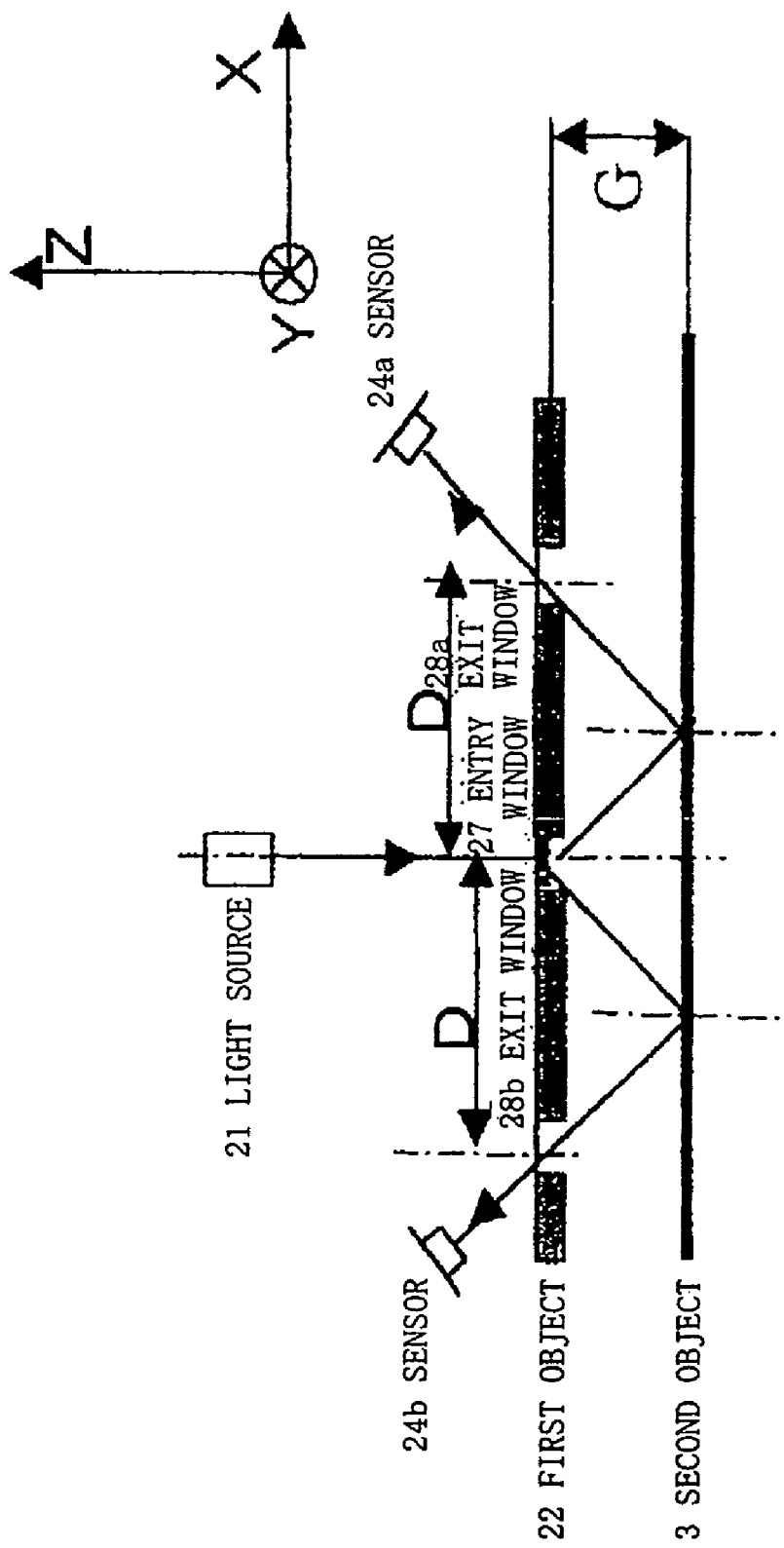
FIG. 6 is a typical sectional view for explaining a method of a third embodiment according to the present invention, which adjusts a gap between two plate-shaped objects.

Referring to FIG. 6, a description will now be given of the third embodiment of the present invention. An element in this figure, which corresponds to that in the first and second embodiments, is designated by the same reference numeral, and a description thereof will be partially omitted.

A method for adjusting a gap according to this embodiment provides an entry window 27 in the first object 22, and two exit windows 28a and 28b at both its sides. A light source 21 is adapted so as to introduce light to this entry window perpendicularly from above.

Similar to the first embodiment, the entry window 27 is formed into a linear diffraction grating with the pitch Px that meets the equation (1) so that incident light with a wavelength of λ may be diffracted by a 1st order diffracted angle of θ. The method for adjusting a gap according to this embodiment makes this entry window 27 serve as the entry windows 17a and 17b in the second embodiment. Namely, when light is introduced into the entry window 27, in addition to the 1st order diffracted light having the 1st order diffracted angle of θ, −1st order diffracted light is produced in an opposite direction by an angle θ. The exit windows 28a and 28b are arranged respectively in place i.e., in opposite directions from the entry window 27 (or right and left directions in FIG. 6) at a distance D that satisfies the equation (2) so that they would receive, if the gap between the first and second objects 22 and 3 is the designed gap G, the plus and minus first order diffracted light through the entry window 27 that has been reflected as a regular reflection off of the surface of the second object 3. The sensors 24a and 24b are arranged in place so that they can detect the light from the exit windows 28a and 28b.

Like the second embodiment, even if there is a slightly shifted tilt component (ωy) around the Y-axis at the relative position between two objects, the gap between the two objects can be made a desirable one with high precision. In other words, the center between the two positions, which provides the strongest light intensity detected by the sensors 24a and 24b, can be determined as the position that provides the gap G between two objects along the Z-axis running through the center of the entry window. It is possible to move the second object 3 to this position by using the Z-stage, and to arrange the two objects with high precision such that they have the designed gap G.

(Fourth Example)

Figure 7:
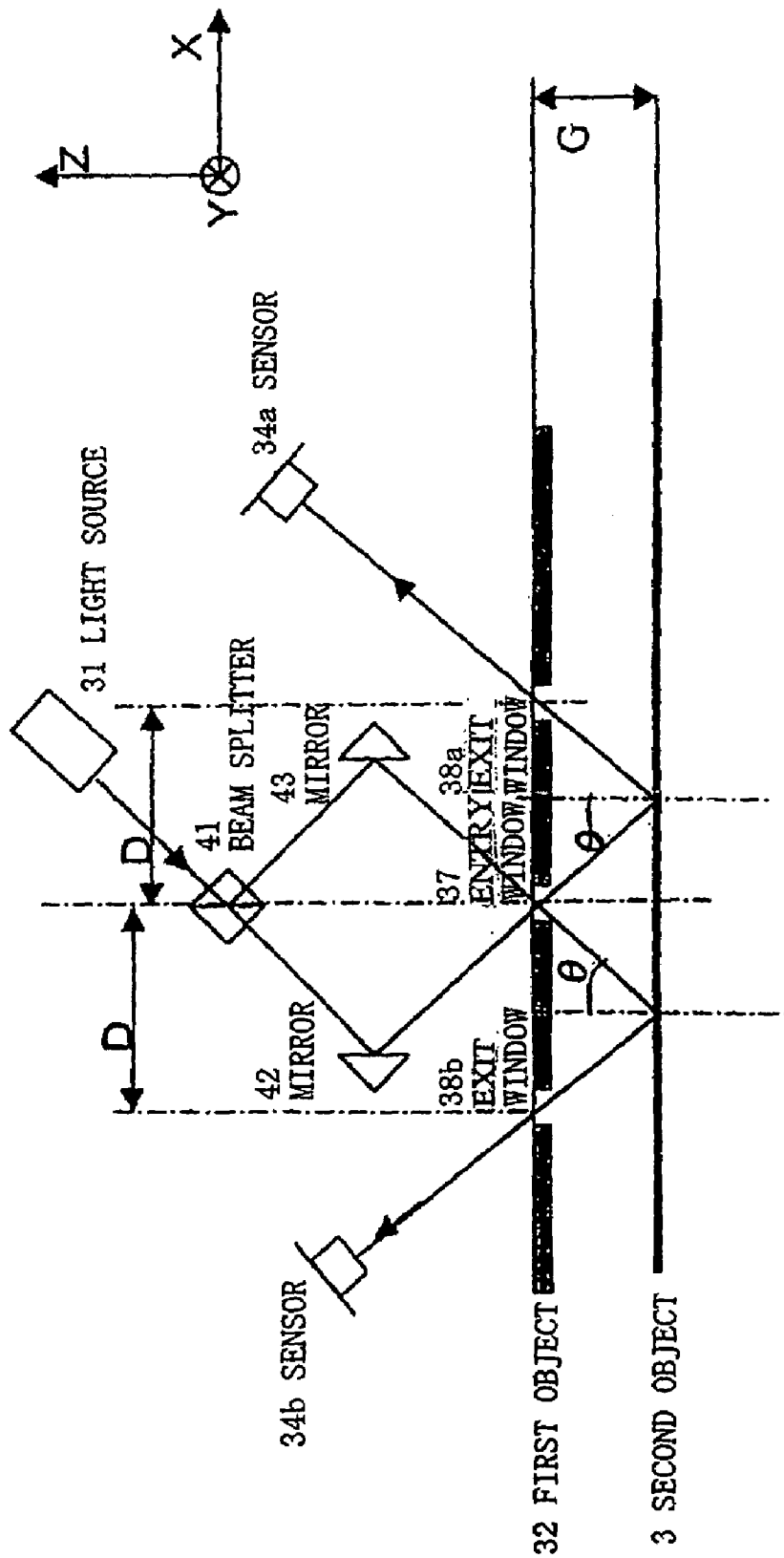
FIG. 7 is a typical sectional view for explaining a method of a fourth embodiment according to the present invention, which adjusts a gap between two plate-shaped objects.

Referring to FIG. 7, a description will now be given of the fourth embodiment of the present invention. An element in this figure, which corresponds to that in the first to third embodiments, is designated by the same reference numeral, and a description thereof will be partially omitted.

A method for adjusting a gap according to this embodiment provides one entry window in the first object 32, and two exit windows 38a and 38b at both its sides. The entry window does not have a diffraction grating, but has an aperture pattern.

The method of this embodiment introduces light into the entry window 37 with an angle of incidence θ, instead of diffracting light incident upon the entry window 37. In an illustration in FIG. 7, a light source 31 is arranged such that it introduces light diagonally to the lower left. A beam splitter 41 is provided on the way this light travels, and the light incident upon this is split into two, one of which propagates diagonally to the lower left and the other propagating diagonally to the lower right. There are mirrors 42 and 43 on the way the split respective beams travel. The arranged positions and angles of these mirrors 42 and 43 are adjusted such that the reflected light is guided to the entry window 37 diagonally to the lower right and lower left, respectively with an incident angle θ.

Due to this configuration, light incident upon the entry window 37 with an incident angle θ arrives at the second object 3 with the incident angle θ, thus being reflected as a regular reflection. The exit windows 38a and 38b are arranged in place so that the reflected light passes, i.e., away from the entry window 37 in opposite directions at a distance D that satisfies the equation (2). The sensors 34a and 34b are arranged in place so that they can detect the light having passed through the exit windows 38a and 38b.

Similar to the second and third embodiments, the method of this embodiment would make a gap between two objects a desirable one with comparatively high precision even if there is a slightly shifted tilt component (ωy) around the Y-axis at the relative position of the two objects.

(Fifth Embodiment)

Figure 8:
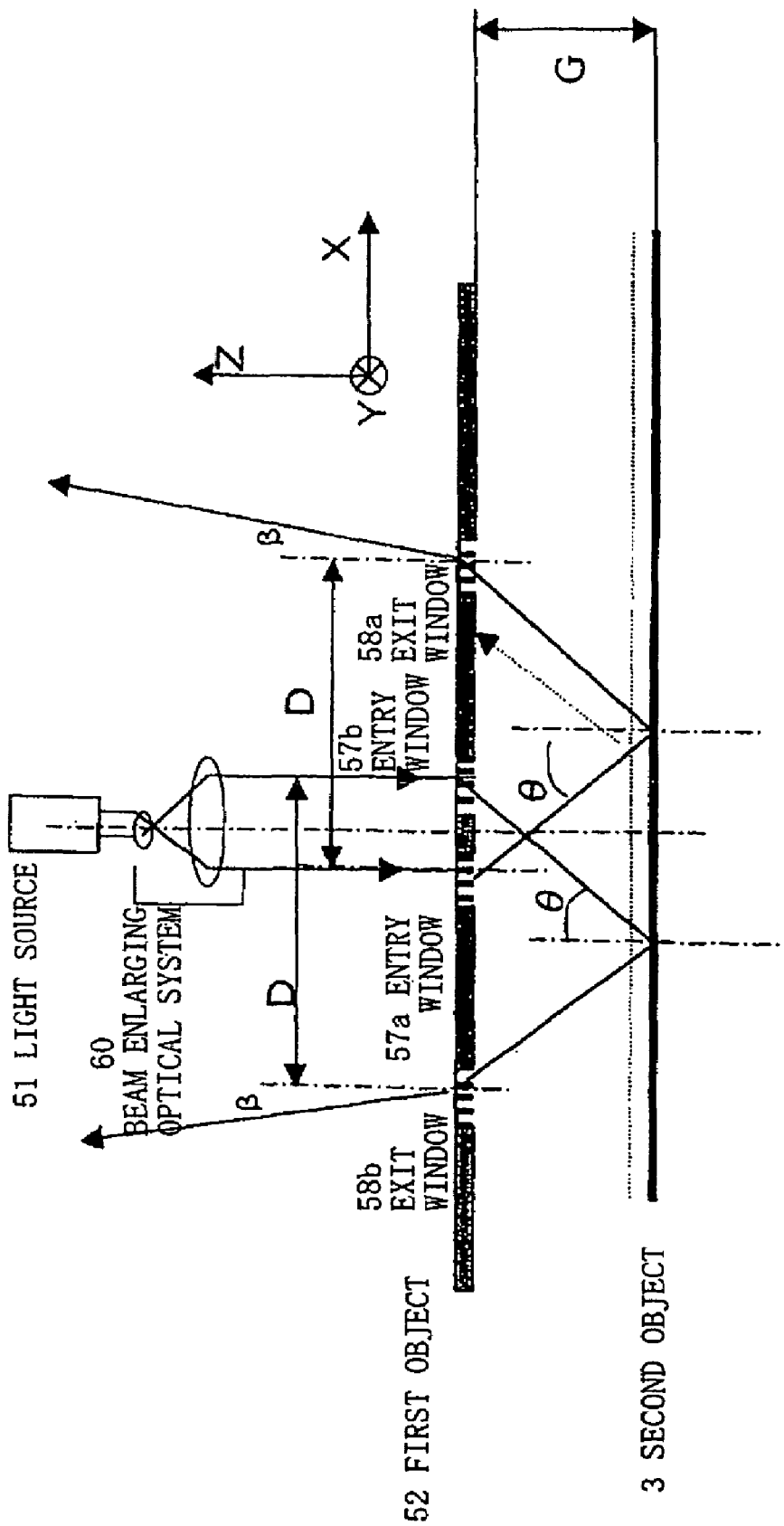
FIG. 8 is a typical sectional view for explaining a method of a fifth embodiment according to the present invention, which adjusts a gap between two plate-shaped objects.
Figure 9:
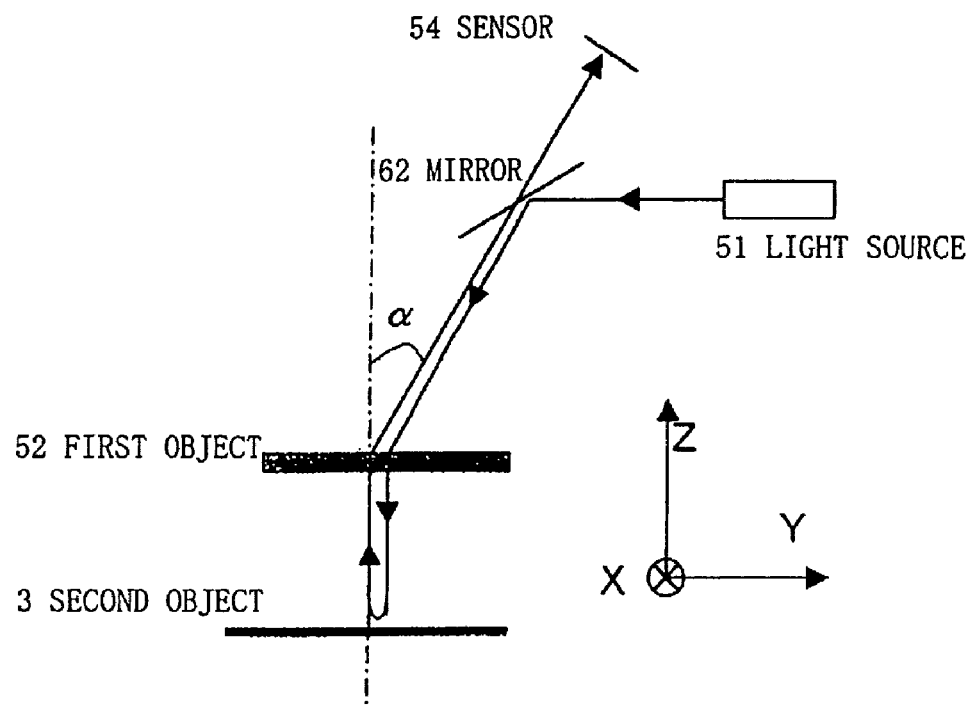
FIG. 9 is a sectional view taken along a Y-direction of FIG. 8.
Figure 10:
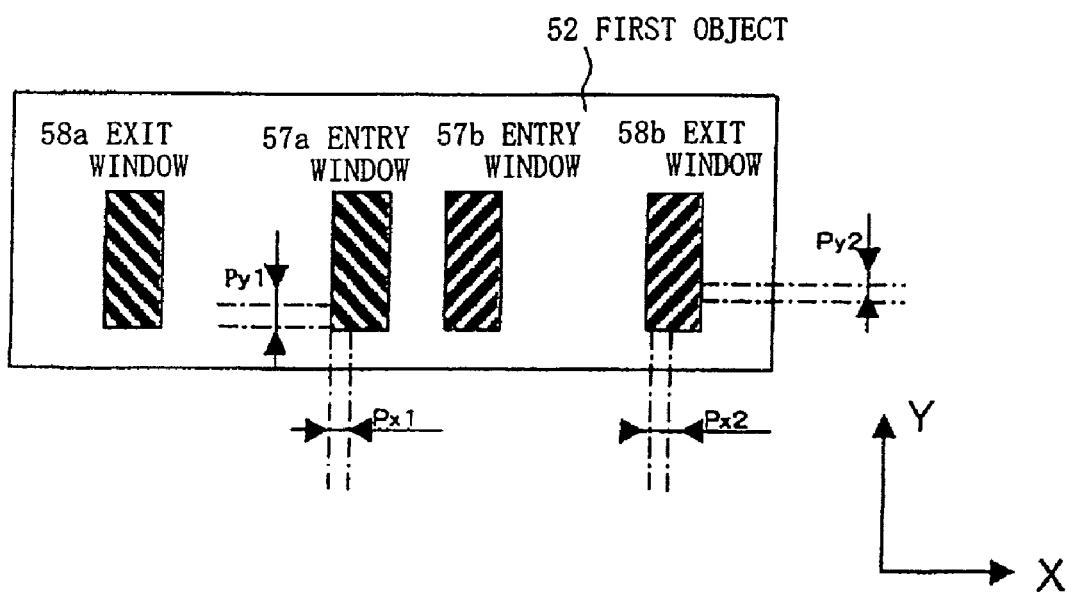
FIG. 10 is a plan view of the first object in FIG. 8.

Referring to FIGS. 8–13, a description will now be given of the fifth embodiment of the present invention. FIGS. 8–10 are typical views for explaining a gap determination of this embodiment. FIG. 8 is a sectional view taken in the X-direction. FIG. 9 is a sectional view taken in the Y-direction. FIG. 10 is a plan view. An element in this figure, which corresponds to that in the first to fourth embodiments, is designated by the same reference numeral, and a description thereof will be partially omitted.

This embodiment provides two entry windows 57a and 57b in the first object 52 comparatively close to each other, and two exit windows 58a and 58b at both their sides. The entry windows 57a and 57b are transmission type diffraction gratings whose light transmitting parts are formed with a pitch Px1 in the X-direction and a pitch Py1 in the Y-direction. This embodiment introduces, not vertically but at an inclined incident angle α in the Y-direction, light to the entry windows 57a and 57b from a light source 51 through a beam enlarging optical system 60. FIG. 9 exemplarily shows that light from the light source 51 is reflected at a mirror 62, and introduced at an incident angle α.

The pitch Px1 in the X-direction of the diffraction gratings formed in the entry windows 57a and 57b satisfies:

$$Px1=\lambda/\sin\theta \quad (4)$$

whereby light with a wavelength of λ vertically incident on the X-axis may be diffracted as 1st order diffracted light in the X-direction at an angle θ.

In addition, the pitch Py1 in the Y-direction of the diffraction gratings formed at the entry windows 57a and 57b satisfies:

$$Py1=\lambda/\sin\alpha \quad (5)$$

so that light with a wavelength of λ inclined to Y-direction and incident at an incident angle α may be diffracted as 1st order diffracted light in a direction perpendicular to the Y-axis.

The exit windows 58a and 58b are arranged in place so that they would receive, if the gap between the two objects is the designed gap G, light that has been diffracted as 1st order diffracted light from the entry windows 57a and 57b, then led to the second object 3 inclined in X-direction at an incident angle θ, and reflected off its surface as a regular reflection, i.e., away from the entry windows 57a and 57b in the X-direction at a distance D that satisfies the equation (2).

This embodiment makes each of the exit windows 58a and 58b of a linear diffraction grating with a pitch Px2 in the X-direction and a pitch Py2 in the Y-direction. The pitch Px2 in the X-direction of these exit windows 58a and 58b satisfies:

$$Px2=\lambda/(\sin\theta-\sin\theta) \quad (6)$$

so that 1st order diffracted light of the light inclined in the X-direction and incident at an incident angle α' may exit at an angle of exit β in the X-direction.

The pitch Py2 in the Y-direction of the exit windows 58a and 58b satisfies:

$$Py2=\lambda/\sin\alpha' \quad (7)$$

so that 1st order diffracted light of light vertically incident on the Y-axis may exit at an angle of exit α' in the Y-direction. FIG. 9 illustrates α=α'.

Here, suppose an example using the wavelength λ of 785 mn and the designed gap G of 70 μm. Assuming that Px1=1.3 μm, and Px2=1.5 μm, θ=37.15° from the equation (4), and β=4.61° from the equation (6). Further, assuming α=α'=15°, Py1=Py2=3.03 μm from the equations (5) and (7).

The method of this embodiment may adjust an angle of light entering the entry windows 57a and 57b and an angle of light exiting from the exit windows 58a and 58b by making the entry and exit windows 57a, 57b, 58a and 58b of linear diffraction gratings having predetermined pitches in the X- and Y-directions. Such a configuration would enhance the degree of freedom of a light projecting system that introduces light to the entry windows 57a and 57b and a light receiving system that receives light from the exit windows 58a and 58b.

Figure 11:
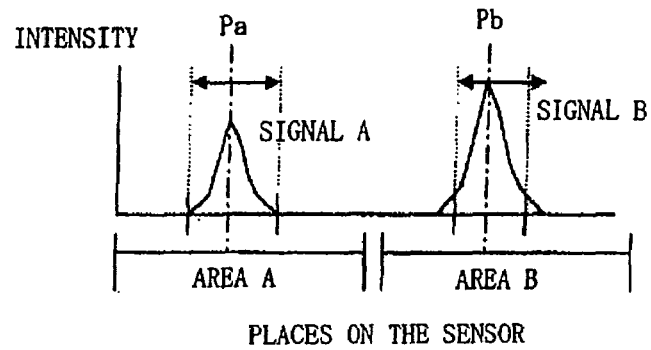
FIG. 11 is a graph showing the changing intensity of light detected by a sensor for various gaps between two objects in the method shown in FIG. 8.
Figure 12:
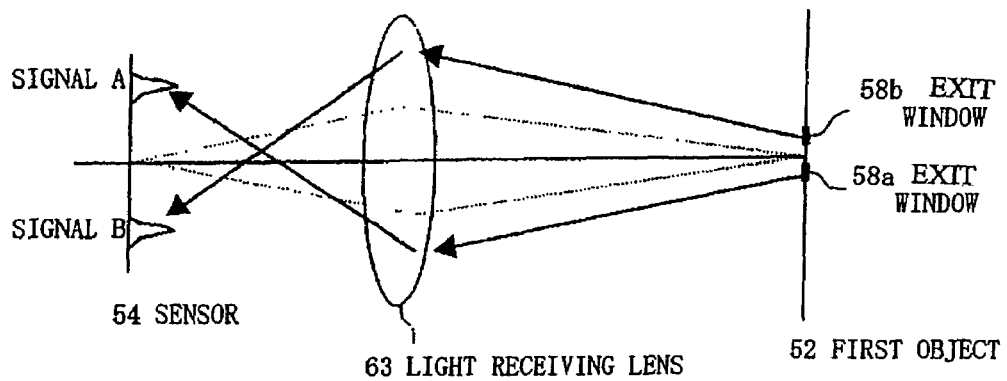
FIG. 12 is a light receiving system in the method shown in FIG. 8.

In particular, a configuration of this embodiment enables one sensor 54 to detect light from the exit windows 58a and 58b. In other words, as shown in FIG. 12, a light-receiving lens 63 is provided at such a position that it may receive light from the exit windows 58a and 58b, and introduce each light to the sensor 54 through refraction. At this time, as shown in FIG. 11, the signal "A" as the light from the exit window 58a and the signal "B" as the light from the exit window 58b are adapted to enter different spots "A" and "B" on the sensor 54, respectively. This structure would make it possible to separately detect the intensity of light from the exit window 58a based on signal's peak position Pa in the spot "A" and the intensity of the light from the exit window 58b based on signal's peak position Pb in the spot "B".

Figure 13:
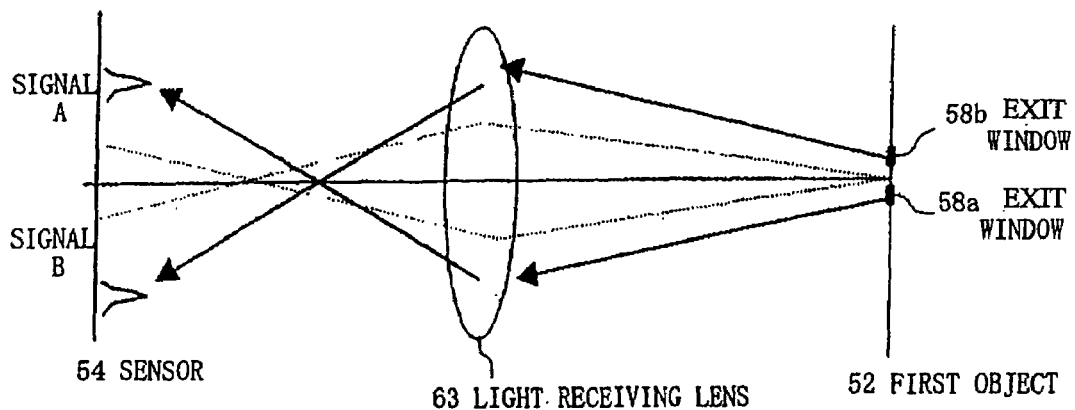
FIG. 13 is a typical view showing a variation of shown in FIG. 12.

The first object 52, sensor 54, and the light-receiving lens 63 are arranged, as shown in FIG. 12, such that the sensor 54 and the light-receiving lens 63 are optically conjugate with each other (or in a relationship between an object and image). However, as shown in FIG. 13, it may be so adapted that the sensor 54 is located at a position away from there. Accordingly, since the light-receiving angle can be an exit angle of ±4.61° of emitted diffracted light plus a spreading angle of the diffracted light, the NA of the receiving lens can be made small.

Thus, this embodiment would enhance the degree of freedom for the light-projecting and light-receiving systems, and facilitate a fabrication of the apparatus. In addition, the light-projecting and light-receiving systems may be integrated into one member, and the NA of the light-receiving lens may be made small as discussed above, thus realizing a miniaturization of the apparatus.

(Sixth Embodiment)

Figure 14:
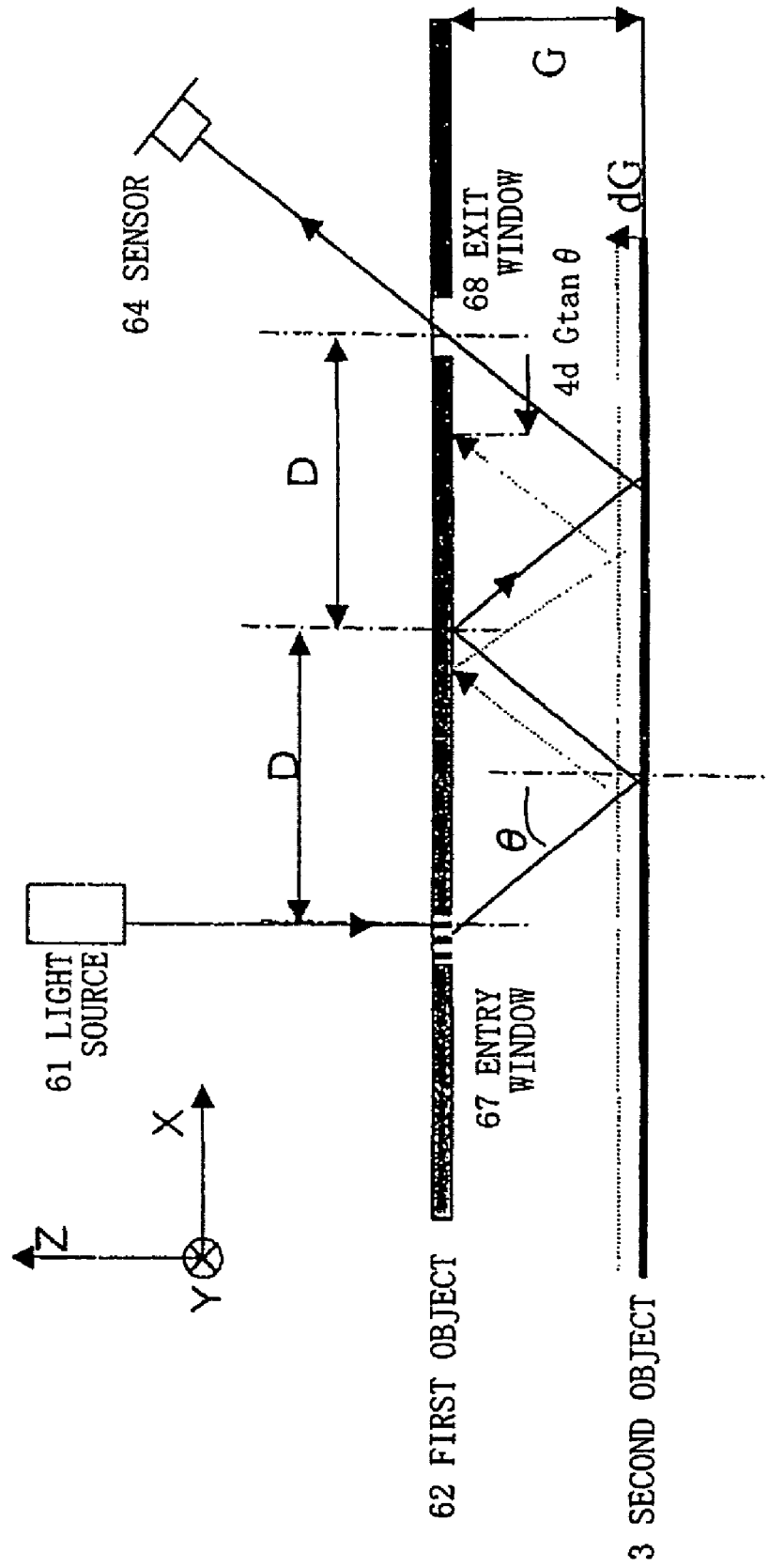
FIG. 14 is a typical sectional view for explaining a method of a sixth embodiment according to the present invention, which adjusts a gap between two plate-shaped objects.

Referring to FIG. 14, a description will now be given of the sixth embodiment. An element in this figure, which corresponds to that in the first to fifth embodiments, is designated by the same reference numeral, and a description thereof will be partially omitted.

This embodiment provides, as in the first embodiment, an entry window 67 with a linear diffraction grating with a pitch Px that satisfies the equation (2), and an exit window 68 with an aperture pattern in the first object 62. In this embodiment, a distance 2D between the entry window 67 and the exit window 68 is different from that in the first embodiment, i.e., twice as large as D that satisfies the equation (1).

It is assumed that the first and second objects 62 and 3 form the designed gap G in this structure. Light with a wavelength of $\lambda$ introduced to the entry window 67 vertically from a light source 61 generates light diffracted by a 1st order diffraction angle $\theta$. This diffracted light enters the second object 3 at an incident angle $\theta$, and is reflected as a regular reflection. This reflected light enters the first object 62 at the incident angle $\theta$, and at this time, is reflected as a regular reflection off the first object 62. Again, it enters the second object 3 and its regularly reflected light arrives at a position on the first object 62, where the exit window 68 opens. The sensor 64 is located at such a position that it can detect the light thus passing trough the exit window 68.

A gap is adjusted, like the first embodiment, while changing the gap between the first and second objects 62 and 3 by moving the second object 3 up and down using the Z-stage, thus measuring the changing light intensity using the sensor 64. The arrangement that provides the strongest light intensity detected is determined as the arrangement that provides the designed gap G between the first and second objects 62 and 3.

Since the light used to adjust the gap is reflected twice off the second object 3 in the structure of this embodiment, a large changing rate of the intensity of the light detected by the sensor 4 is available for a shift dG from the designed gap G. In the first embodiment, if a gap between the first and second objects shifts by dG from the designed gap G, the shift from the exit window 68 at the position of the reflected light incident upon the first object is 2 dG tan $\theta$. On the other hand, in the structure of this embodiment, this shift is a doubled 4 dG tan $\theta$, and therefore the changing rate of the light intensity grows larger, whereby a gap may be adjusted more precisely.

The distance between the entry and exit windows may be n times as much as D (n is a natural number) to reflect light n times off the second object. Then, while the gap between the first and second objects shifts by dG from the designed gap G, a shift, from the exit window, of the position of the reflected light incident upon the first object is 2 ndG tan $\theta$, whereby a gap may be adjusted more precisely.

(Seventh Embodiment)

Figure 15:
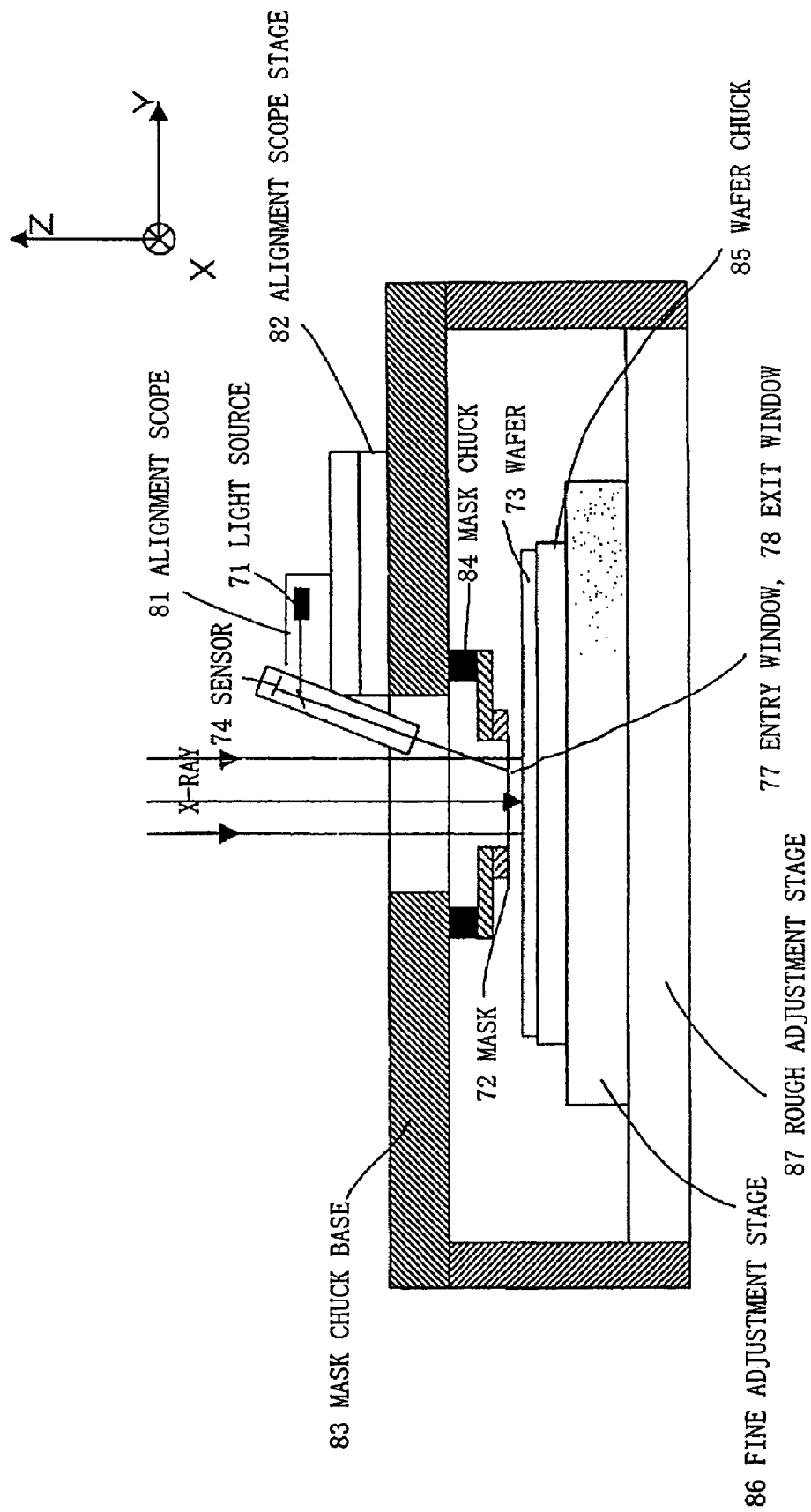
FIG. 15 is a typical sectional view of an X-ray exposure apparatus of a seventh embodiment according to the present invention.
Figure 16:
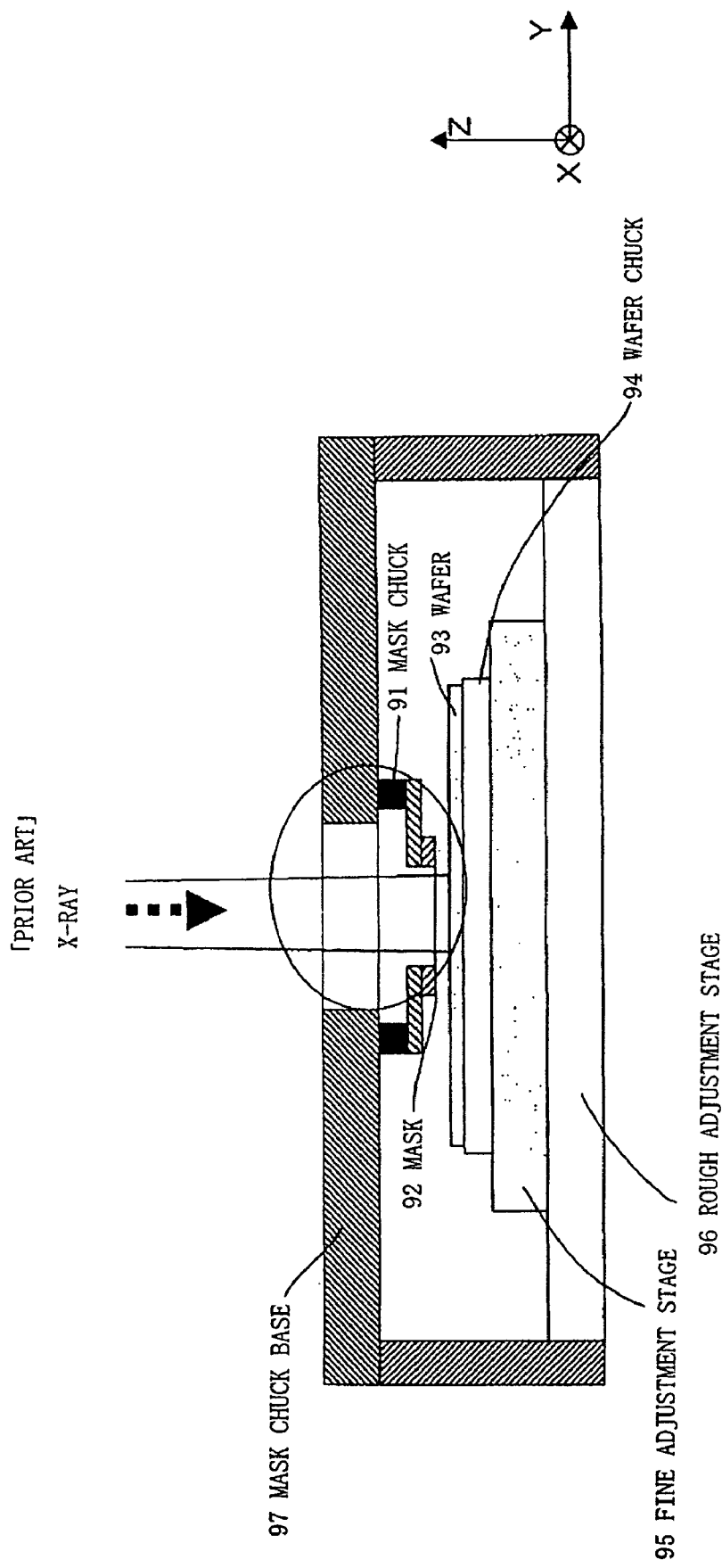
FIG. 16 is a typical sectional view of a conventional X-ray exposure apparatus.
Figure 17:
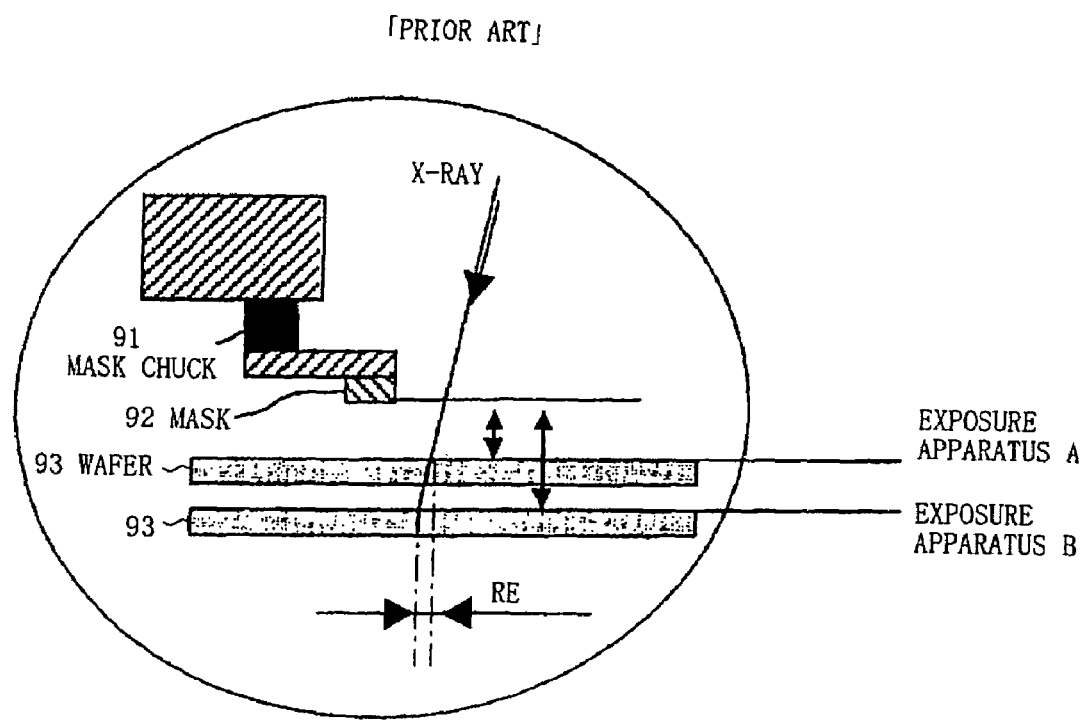
FIG. 17 is an enlarged view of an exposure part FIG. 16.

Referring to FIG. 15, a description will now be given of the seventh embodiment that exemplarily applies the method for adjusting a gap according to the present invention to an X-ray exposure apparatus. FIG. 15 is a typical sectional view of an X-ray exposure apparatus of this embodiment.

This X-ray exposure apparatus includes a wafer chuck 85 for holding a wafer 73 and a mask chuck 84 for holding a mask 72 in parallel near the mask 73. The wafer chuck 84 is supported by a fine adjustment stage 86 that adjusts its position in the XYZ directions finely, which, in turn, is supported by a rough adjustment stage 87 that adjusts its position in the XY directions roughly. The mask chuck 84 is supported below the mask chuck base 83 that is arranged opposed to the wafer chuck 85. An X-ray light source (not shown) is provided above the mask chuck base 83, and an opening is provided in the mask chuck base 83, through which an X-ray is to be radiated from top to down almost vertically.

An X-ray emitted from the X-ray light source is radiated through the mask 72 onto the wafer 73 to which resist is applied, thus exposing the resist. In exposing the wafer 73 by a specified pattern on the mask 72, the resist is exposed and the pattern is transferred. By removing the exposed or unexposed part from the resist that has been exposed by the specified pattern, a semiconductor circuit of the specified pattern will be created.

The X-ray exposure apparatus of this embodiment further includes an alignment scope 81 used to adjust the relative position between the mask 72 and wafer 73. The alignment scope 81 is supported by an alignment scope stage 82 on the mask chuck base 83 near the edge of the opening for X-ray radiation. The alignment scope 81 is equipped with a light source 71 and a sensor 74 for detecting the light intensity. The alignment scope 81 includes a specified optical system combining lenses and mirrors, which is adapted such that light from the light source is radiated onto the mask 72 at a specified position and at a specified angle of incidence, and the light from the specified position of the mask 72 at a specified angle of exit is guided to the sensor 74.

This alignment scope 81 detects alignment marks formed on the mask 72 and wafer 73, and uses them to adjust the positions of the mask 72 and wafer 73 in X-, Y-directions and adjust their relative position in X-, Y-directions.

This embodiment makes use of this alignment scope 81 to adjust a gap between the mask 72 and wafer 73. A description will be now given of the method for adjusting the gap between them.

An entry window 77 and an exit window 78 of a specified pattern are formed in place in the mask 72. In this embodiment, the pattern, shown in FIG. 10 and described in connection with the fifth embodiment, is formed by EB drawing and used. Light from the light source 71 enters the entry window 77 at a specified angle of incidence, and the sensor 74 detects the intensity of the light from the exit window 78, while a position of the wafer 73 is changed in Z-direction using the fine adjustment stage 86. This may determine the arrangement that provides the gap G between the mask 72 and wafer 73 (in this embodiment, especially as shown in the fifth embodiment, it is 70 µm). This Z-position of the wafer 73 is stored, for example, in a computer and the like for controlling the operations of the X-ray exposure apparatus. In an actual exposure, the wafer 73 is moved to the stored Z-position by using the fine adjustment stage 86, and the exposure follows.

As described above, this embodiment forms the predetermined gap between the mask 72 and wafer 73 with high precision without contacting them, and may fabricate high-quality semiconductor devices with high yield.

This embodiment has adopted the pattern shown in the fifth embodiment as a pattern for the entry and exit windows 77 and 78 to be formed in the mask 72. It preferably uses the alignment scope 81, which integrates the light source 71 and sensor 74 and is used to align the mask 72 and wafer 73 in the XY directions, to adjust the gap between the mask 72 and wafer 73. Of course, a gap may be adjusted by providing a light source and a sensor separately, and forming entry and exit windows in the mask, which include other patterns shown in the first to sixth embodiments, or a combination of these embodiments.

As described above, use of the present invention would enable one to provide a gap between two plate-shaped objects with a specified absolute value, without contacting them. The method for adjusting a gap according to the present invention, when applied to position a mask and wafer at a predetermined gap in an exposure apparatus, would provide an exposure apparatus that can fabricate devices with high precision and high yield.

What is claimed is:

1. A method of making a gap between first and second objects have a predetermined value, said method comprising the steps of:

a first introduction step of introducing light to a first entry window on the first object;

a first detection step of detecting a first total intensity of light from a first exit window on the first object with respect to each of a plurality of values of the gap, the first exit window being at such a position that light would enter through the first entry window of the first object, reflect off the second object, and then enter the first exit window if the gap has the predetermined value;

a second introduction step of introducing light into a second entry window on the first object;

a second detection step of detecting a second total intensity of light from a second exit window on the first object with respect to each of a plurality of values of the gap, the second exit window being at such a position that light would enter through the second entry window of the first object, reflect off the second object, and then enter the second exit window if the gap has the predetermined value;

an obtaining step of obtaining a position of the second object, with respect to a direction of the gap, where the gap has the predetermined value based on a plurality of total intensities of light detected in said first detection step and a plurality of total intensities in said second detection step; and a positioning step of positioning the second object at the position obtained in said obtaining step, wherein said first and second introduction steps respectively introduce light to a diffraction grating, as the first and second entry windows, common to said first detection step and said second detection step.

2. A method according to claim 1, wherein said first detection step detects a total intensity of light from a first diffraction grating in the first exit window, and said second detection step detects a total intensity of light from a second diffraction grating in the second exit window.

3. A method according to claim 1, wherein said first detection step includes a step of: varying a position of the second object with respect to the direction of the gap while light is introduced to the first entry window on the first object and a total intensity of the light from the first exit window on the first object is detected.

4. A method according to claim 1, wherein said second detection step includes a step of varying a position of the second object with respect to the direction of the gap while light is introduced to the second entry window on the first object and a total intensity of the light from the second exit window on the first object is detected.

5. An apparatus for making a gap between first and second objects, said apparatus comprising:

a light introducing unit configured to introduce light to a first entry window formed in the first object;

a first detection unit configured to detect a total intensity of light from a first exit window formed in the first object with respect to each of a plurality of values of the gap, the first exit window being at such a position that light would enter through the first entry window of the first object, reflect off the second object, and then enter the first exit window if the gap has a predetermined value;

a second detection unit configured to detect a total intensity of light from a second exit window formed in the first object with respect to each of a plurality of values of the gap, the second exit window being at such a position that light would enter through a second entry window of the first object, reflect off the second object, and then enter the second exit window if the gap has the predetermined value; and a positioning mechanism configured to obtain a position of the second object, with respect to a direction of the gap, where the gap has the predetermined value based on a plurality of total intensities of light detected by said first detection unit and a plurality of total intensities of light detected by said second detection unit, and to position the second object at the obtained position, wherein said light introducing unit is configured to introduce light to a diffraction grating, as the first and second entry windows, common to said first detection unit and said second detection unit.

6. An apparatus according to claim 5, wherein said first detection unit is configured to detect a total intensity of light from a first diffraction grating in said first exit window, and said second detection unit is configured to detect a total intensity of light from a second diffraction grating in the second exit window.

* * * * *